United States Patent
Hirota

(10) Patent No.: US 6,603,692 B2
(45) Date of Patent: Aug. 5, 2003

(54) SEMICONDUCTOR MEMORY DEVICE IMPROVING DATA READ-OUT ACCESS

(75) Inventor: Takuya Hirota, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/880,469

(22) Filed: Jun. 13, 2001

(65) Prior Publication Data

US 2002/0001249 A1 Jan. 3, 2002

(30) Foreign Application Priority Data

Jun. 15, 2000 (JP) .................................... 2000-179300

(51) Int. Cl.[7] .............................. G11C 7/00; G11C 7/02; G11C 8/00
(52) U.S. Cl. ................... 365/203; 365/189.05; 365/194; 365/207; 365/214; 365/230.06; 365/230.08
(58) Field of Search ....................... 365/230.03, 189.05, 365/194, 203, 214, 230.06, 230.08, 207

(56) References Cited

U.S. PATENT DOCUMENTS

| | | | | |
|---|---|---|---|---|
| 4,894,803 A | * | 1/1990 | Aizaki .................... 365/189.05 |
| 5,313,434 A | * | 5/1994 | Abe .......................... 365/233.5 |
| 5,555,523 A | * | 9/1996 | Haga et al. .................. 365/203 |
| 5,576,641 A | * | 11/1996 | Yoneya et al. .................. 326/83 |
| 5,594,704 A | * | 1/1997 | Konishi et al. ............. 365/233 |
| 5,815,451 A | * | 9/1998 | Tsuchida .................... 365/203 |
| 5,838,990 A | * | 11/1998 | Park et al. .................... 710/14 |
| 5,982,689 A | * | 11/1999 | Takahashi ..................... 327/51 |
| 6,160,746 A | * | 12/2000 | Park et al. ................... 365/203 |
| 6,201,728 B1 | * | 3/2001 | Narui et al. ................. 365/149 |
| 6,226,215 B1 | * | 5/2001 | Yoon ...................... 365/185.23 |
| 6,275,429 B1 | * | 8/2001 | Bae et al. .................... 365/203 |
| 6,292,416 B1 | * | 9/2001 | Reddy et al. ............... 365/190 |
| 6,310,811 B1 | * | 10/2001 | Kohno ........................ 365/210 |
| 6,320,806 B1 | * | 11/2001 | Han ...................... 365/189.05 |
| 6,333,881 B1 | * | 12/2001 | Kusunoki et al. ........... 365/154 |
| 6,345,006 B1 | * | 2/2002 | Ingalls et al. ............... 365/149 |
| 6,418,073 B1 | * | 7/2002 | Fujita ........................ 365/203 |
| 2001/0040817 A1 | * | 11/2001 | Azuma ........................ 365/154 |
| 2002/0021609 A1 | * | 2/2002 | Kitamoto et al. ........... 365/222 |
| 2002/0027799 A1 | * | 3/2002 | Sakata et al. ............... 365/145 |

* cited by examiner

*Primary Examiner*—Hoai Ho
*Assistant Examiner*—Ly Duy Pham
(74) *Attorney, Agent, or Firm*—Choate, Hall & Stewart

(57) ABSTRACT

A semiconductor memory device, capable of being accessed at a high speed, according to the present invention, is provided, and is configured with the changeover point in time between the pre-charge operation and a word line selection operation on the far-end side of the sense amplifier being earlier than that on the near-end side of it. There are provided word selection signal input buffer, block selection signal input buffer, digit selection signal input buffer on semiconductor chip, decoders, which decode the said signals, drivers for the output signal of each decoder, memory block, which is stored with information, and gate circuit, which selects a column of memory cells in a memory block. Drivers for the word selection signal and block selection signal are laid out in the middle of chip and near far-end side pre-charge unit, which is located the farthest from the sense amplifier (which is deployed in near-end side pre-charge unit.

6 Claims, 6 Drawing Sheets

SEMICONDUCTOR MEMORY DEVICE IMPROVING DATA READ-OUT ACCESS

BACKGROUND OF THE INVENTION

1. Field of the Invention

The present invention relates to a semiconductor memory device. In particular, it relates to a semiconductor memory device layout so that the read-out speed of the semiconductor memory device can be high.

2. Description of a Related Art

Efforts for improving integration and capacity of semiconductor memory devices have been continuously made so that many memory cells can be connected to pairs of digit lines. Accordingly, the capacitance on digit lines becomes large, causing the access delay to increase, preventing the high speed operation from being performed. To solve this problem, the inventor of the present invention supposed that pre-charge circuits are deployed at both ends of the digit lines, for example, so that the high speed recovery (pre-charge) after a writing is performed can be performed.

FIG. 1 is a diagram showing the layout of a chip of a semiconductor memory device of a related art, supposed by the inventor. On semiconductor chip 1 input buffers such as word selection signal input buffers 2, block selection signal input buffers 3, and column selection signal input buffers 4 are provided; wherein for each input buffer, word signal decoder 5, which decodes the respective each output signal of it, block signal decoder 6, and column signal decoder 7 are provided. At the output end of each decoder, word signal driver 8, block signal driver 9, and column signal driver 10, which function as buffers for the output signals of the respective decoders, are provided. These drivers 8 to 10 are deployed along the longer sides of the chip.

In the middle of the chip, memory blocks BL0 to BL31 are laid out. A memory cell array of memory cell block 11, near-end side pre-charge unit 12, and far-end side pre-charge unit 13 are provided in each memory block BL0 to BL31. In near-end side pre-charge unit 12, sense amplifiers are provided. The output signals of column selection/pre-charge control NAND gates G0 to G15, which select a column of memory cells in the memory block, are input to each near-end side pre-charge unit 12.

In this Figure, in order to simplify the description, it is assumed that the number of word selection signals is three, and the number of block selection signals and the number of column selection signals are four bits, respectively. The output of word selection signal input buffers 2 is decoded by word signal decoder 5, input to word signal drivers 8, and coupled to eight word lines in each memory block BL0 to BL31 through word signal lines 14.

In the same manner, the output of block selection signal input buffers 3 is decoded by block signal decoder 6, input to block signal drivers 9; the output of which being then input to the respective far-end side pre-charge unit 13 for each memory block BL0 to BL31 and one of the input terminal of each NAND gate G0 to G15 through each block selection signal line 15.

The output of column selection signal input buffers 4 is decoded by column signal decoder 7, and then input to the other input terminals of NAND gates G0 to G15 through each respective column signal driver 10.

With such configuration, one of eight word lines is selected for thirty-two memory blocks on a single chip so that a single line of memory cells in all the memory blocks may be selected; and the NAND gates connected to either of the two memory blocks are selected by the sixteen block selection signal lines 15.

In such a semiconductor memory device as described above, far-end side pre-charge units 13 are deployed at the farthest position from the each of the respective block signal drivers 9. Accordingly, when the pre-charge operation of the pre-charge circuit is halted for, for example, a read-out operation, transmission of the signal therein takes time causing the halt point in time for the pre-charge operation to be later than the halt point in time of near-end side pre-charge units 12. Besides this, the word lines for the memory cells on the far-end side pre-charge sides of the memory blocks BL are deployed far from word signal drivers 8. Accordingly, the point in time at which a word line is selected for, for example, the read-out operation is later than the point in time at which the word line positioned near near-end side pre-charge units 12 is selected. Furthermore, the transmission time for the signal that is read out to the digit line of the memory cell, which is deployed near far-end side pre-charge unit 13, to reach the corresponding sense amplifier is longer than the transmission time in the case where the memory cell deployed near near-end side pre-charge unit 12 is read out.

In other words, the point in time at which an operation of reading out from the memory cell block deplored near far-end side pre-charge unit 13 where transmitting the read-out signal takes a longer amount of time is later than the start point in time for the memory cell block deployed near near-end side pre-charge unit 12, making it difficult to provide high-speed operation.

The subject of the present invention is to solve the above-mentioned problem, and its objective is to provide a high access speed semiconductor memory device, which is configured with the point in time at which changing from the pre-charge operation to the wordline selection operation, which is performed on the near-end side of each sense amplifier, being no later than the point in time at which the same is performed on the far-end side of each sense amplifier, in order to improve the speed at which reading out the memory cells deployed far from each sense amplifier is performed.

SUMMARY OF THE PRESENT INVENTION

According to an aspect of the present invention, there is provided a semiconductor memory device, which includes a memory cell deployed in a column direction, a pair of digit lines connected to each memory cell, a word line, which is laid crossing said digit lines and selects each memory cell, a sense amplifier, which is positioned on one side of said digit lines, a near-end side pre-charge circuit, which is deployed near said sense amplifier of said digit lines, and a far-end side pre-charge circuit, which is deployed at the opposite end to said sense amplifier of said digit lines. This semiconductor memory device is characterized by the completion point in time of a pre-charge operation of a far-end side pre-charge circuit during a read-out operation being earlier than that of a near-end side pre-charge circuit.

According to an aspect of the present invention, it is preferred that; during a read-out operation, the selection signal for the word line located near the far-end side pre-charge circuit climb up earlier than the word line located near the near-end side pre-charge circuit.

BRIEF DESCRIPTION OF THE DRAWINGS

The above-mentioned and other objects, features and advantages of this invention will become more apparent by referencing the following detailed description of the invention taken in conjunction with the accompanying drawings, wherein.

DETAILED DESCRIPTION OF THE EMBODIMENTS

In the following, embodiments of the present invention are described.

Figure 1:
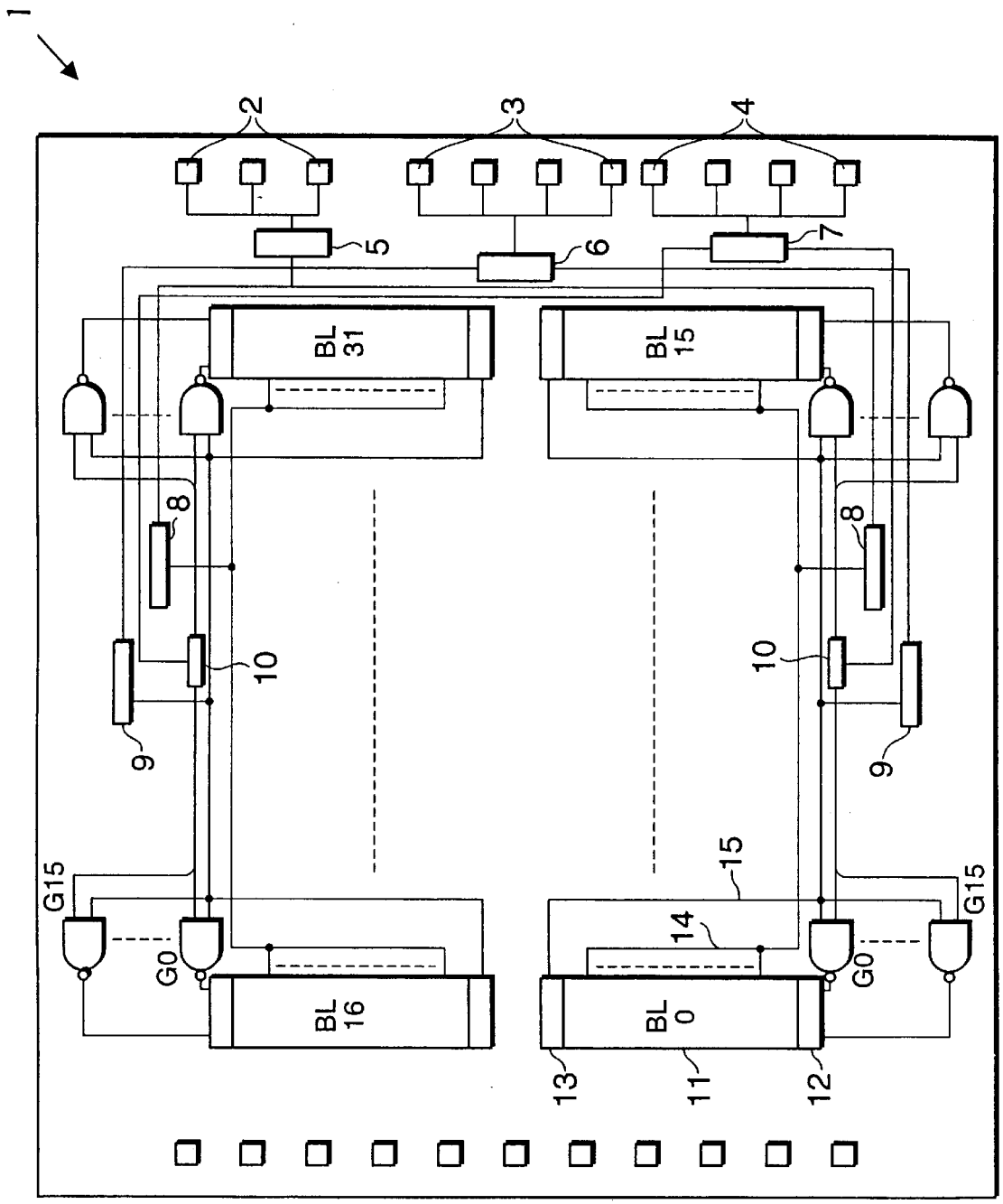
FIG. 1 shows a layout of a semiconductor device of a related art.
Figure 2:
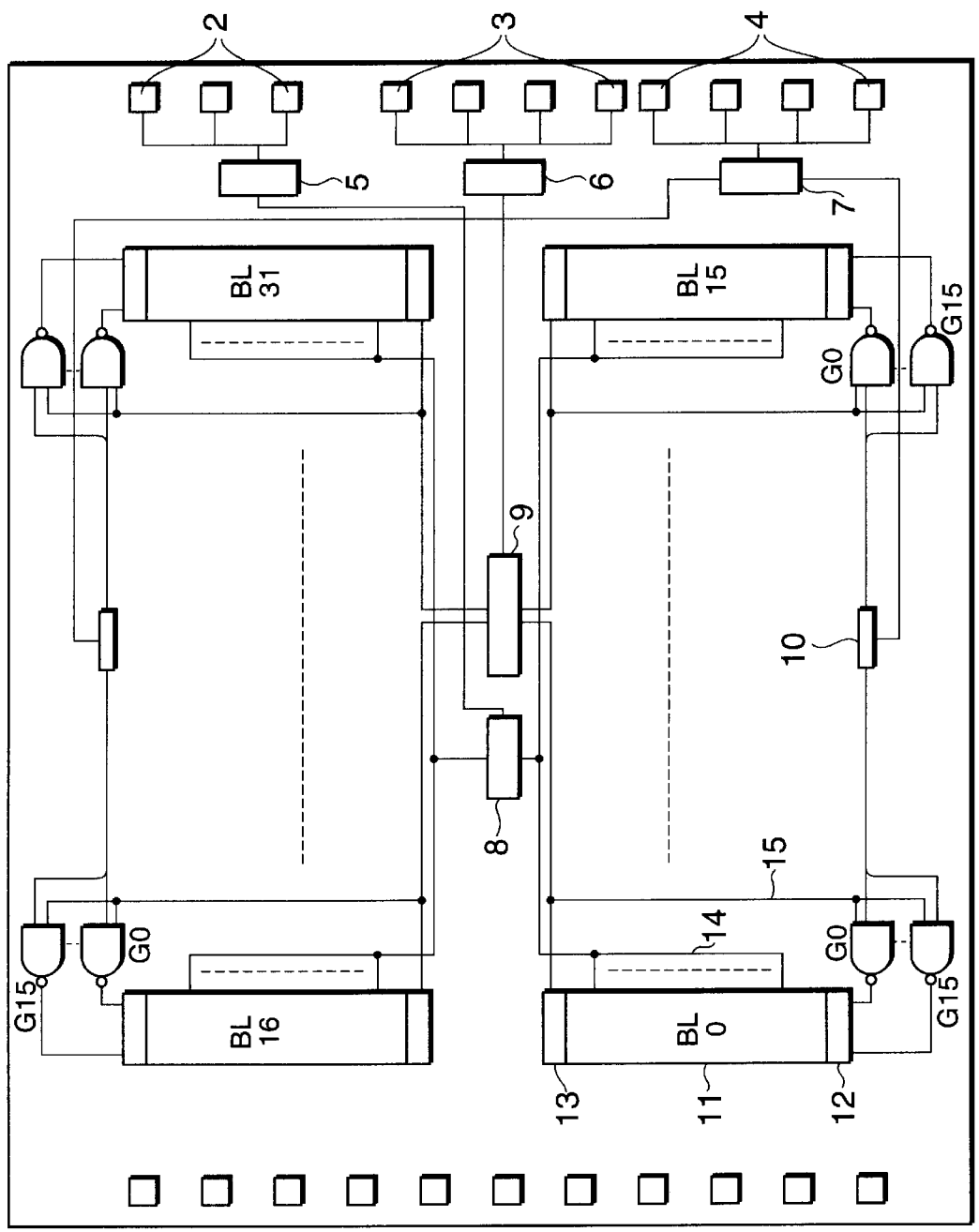
FIG. 2 shows a layout of the first embodiment, according to the present invention.

FIG. 2 is a diagram showing the first embodiment of the present invention. It is noted here that the same parts in FIG. 2 as those in FIG. 1 are labeled with the same respective reference numerals and repetitive descriptions are omitted. What is different from the device as shown in FIG. 1 is that word signal driver 8 and block signal driver 9 are laid out in the center of semiconductor chip 1 of this embodiment.

Figure 3:
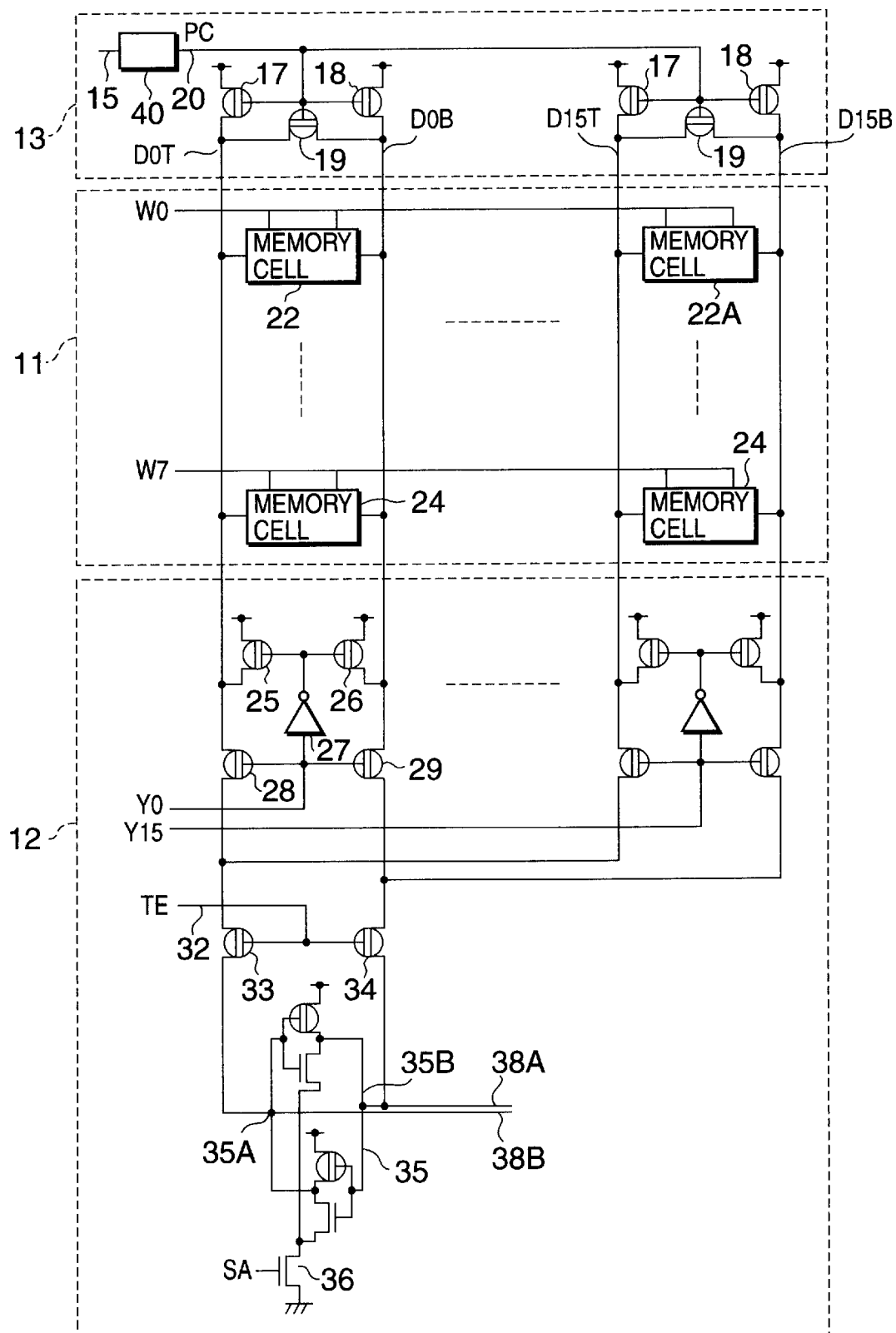
FIG. 3 is a circuit diagram of a memory block of the first embodiment, according to the present invention.
Figure 4:
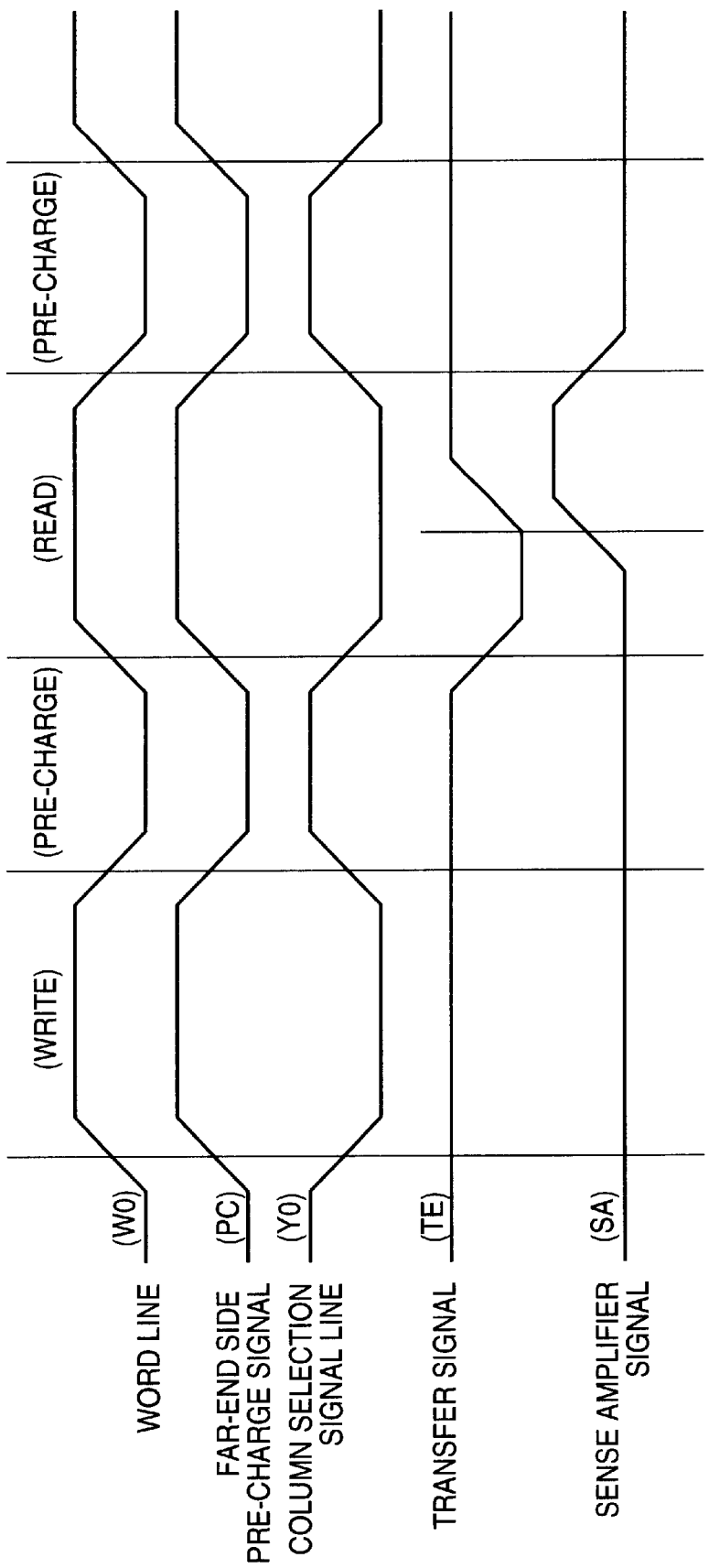
FIG. 4 is a timing chart for the memory block of the first embodiment, according to the present invention.

FIG. 3 is a circuit diagram of memory blocks of the first embodiment of the present invention; FIG. 4 is a timing chart showing a write and read operation of a memory block. This embodiment is an example of a configuration where a pre-charge circuit deployed on the far-end side of the sense amplifier (hereafter, referred to as a far-end side pre-charge circuit) is controlled in conformity with a signal transmitted from block signal driver 9; whereas a pre-charge circuit deployed on the near-end side of the sense amplifier (hereafter, referred to as a near-end side pre-charge circuit) is controlled in conformity with signals transmitted from block signal driver 9 and column signal driver 10.

As shown in FIG. 3, for example, sixteen pairs of digit lines D0T (logical true) and D0B (logical false), . . . , D15T and D15B are deployed in each memory block. In far-end side pre-charge unit 13, the respective drains of p-channel transistors 17 and 18 (hereafter, simply referred to as transistors) are connected to each pair of digit lines, whereas the sources of transistors 17 and 18 are connected to a power supply.

In addition, the drains of transistors 17 and 18 are connected to the respective source and drain of transistor 19, which is capable of performing equalization, with the gate thereof being connected to the gates of transistors 17 and 18. Far-end side pre-charge control line 20 that is connected to this gate is connected to block selection signal 15 via pre-charge control circuit 40.

Eight memory cells are connected to each of the pairs of digit lines D0T and D0B, . . . , D15T and D15B (only eight cells are given for the simplification of the explanation; however, many memory cells are connected in practice). Word lines W0 to W7 are deployed crossing the digital lines, and connected to each memory cell.

Transistors 25 and 26, column selection switches 28 and 29 made up of p-channel transistors, and inverter 27, which form a near-end side pre-charge circuit, are connected to the other ends of the pairs of digit lines D0T and D0B, . . . .

The sources of transistors 25 and 26 in the pre-charge circuit are connected to the power supply; whereas the gates thereof are connected to the output terminal of inverter 27. Each of column selection signal lines Y0 to Y15, which are the output lines of NAND gates G0 to G15, is connected to the corresponding input terminal of inverter 27 and the gates of column selection switches 28 and 29.

The output lines of column selection switches 28 and 29, which are provided along each pair of digit lines, are united into one and connected to transfer gates 33 and 34, which are p-channel transistors. The transfer gates 33 and 34 have a function to nullify the effects of the capacitance of the digit lines by turning off while amplification is being performed by the sense amplifier.

The output of transfer gates 33 and 34 is input to the input nodes 35A and 35B of sense amplifier 35, respectively. Sense amplifier 35 used here is a commonly used dynamic sense amplifier made up of flip-flops, and is configured in a manner such that it is activated by having the gate of n-channel transistor 36 become high level and then latches.

As described above, according to the embodiments of the present invention, the layout is devised such that the word signal driver and the block signal drivers are deployed on the side near far-end side pre-charge (equalize) unit 13; and the signal lines relevant to column are laid around the periphery of the chip.

Next, the operation of reading out from and writing into a memory cell is explained while referencing FIG. 4. It is noted here that the case where memory cell 22 is selected is explained.

Immediately before writing is performed, when far-end side pre-charge signal PC (hereafter, referred to as PC) is at a low level, transistors 17, 18, and 19 turns on, causing digit lines D0T and D0B to be pre-charged onto the power supply level. When column selection signal Y0 is at a high level, transistors 28 and 29 are turned off, and at the same time transistors 25 and 26 are turned on by inverter 27 causing digit lines D0T and D0B to be pre-charged from the sense amplifier side.

Next, word line W0 becomes high level, and memory cells 22 to 22A are selected. At almost the same time, PC and Y0 become high level and low level, respectively; accordingly, transistors 17, 18 and 19 are turned off, column selection switches 28 and 29 are turned on, and transistors 25 and 26 are turned off by inverter 27.

Accordingly, memory cell 22 is selected, separated off the pre-charge circuit and the sense amplifier, and a write operation starts. At this time, transfer signal TE is at a high level so that sense amplifier signal SA does not change and stays at a low level.

FIG. 3 does not show write amplifiers; however, since they are connected to the digit lines between column switches 28 and 29 and transfer gates 33 and 34, and column selection switches 28 and 29 are in an ON state, data provided in the write amplifiers is written in memory cell 22.

Next, W0 and PC become low level again, causing memory cells 22 to 22A to be de-selected, transistors 17, 18, and 19 to turn on, and pre-charge and equalization operation to start. At the same time, Y0 becomes high level and column selection switches 28 and 39 are turned off; however, transistors 25 and 26 are turned on by inverter 27, causing the pre-charge operation to start.

Next, the read-out operation is explained. W0 and PC become high level again, causing memory cells 22 to 22A to be selected and the pre-charge and equalization operations to end. And at the same time, Y0 and TE become low level, causing column selection switches 28 and 29 to turn on and transistors 25 and 26 to turn off, so that the pre-charge operation ends and digit lines D0T and D0B are coupled to the sense amplifier.

At this time, transfer gates 33 and 34 are in an ON state, and during the time when information from memory cell 22 is generated on digit lines D0T and D0B and a voltage difference develops between them (such time corresponding to the access time of the slowest memory cell, which is determined through simulation, and is, for example, approximately 5 ns), a high level is given to SA causing transistor 36 to turn on, and accordingly it is latched by sense amplifier 35. TE is made to be high level in approximately 0.5 ns once the latching is completed, causing sense amplifier 35 to separate off the digit lines. This is because the drive capability of sense amplifier 35 is low and if transfer gates 33 and 34 are left in an ON state, it takes time to bring the digit lines with the added large capacitance to a stable level, thereby causing the read-out speed to be low.

Alternatively, SA may be returned to low level at the point in time when TE becomes at a high level; however, since output lines 38A and 38B of the sense amplifier become a level that is unstable, SA may remain high level except for the cases where a latch circuit is connected on the outside.

In such a manner, the read-out operation is performed by repeating the read-out and pre-charge operation every time the address changes.

Considering the read-out operation of a memory cell, when memory cell 24, which is deployed on the near-end side of sense amplifier 35, is readout, the voltage difference is transmitted to sense amplifier 35 immediately; however, when memory cell 22 deployed on the far-end side is read out, it tales a longer time to transmit the voltage difference to sense amplifier 35. In order to provide high speed access, the capability of performing fast access of memory cell 33, which is deployed on the far-end side of sense amplifier 35, is required.

In other words, the operation of selecting word line 21 on the far-end side of sense amplifier 35 has to be performed earlier than the same operation on the near-end word line 23. Besides this, it is necessary for far-end side pre-charge (equalize) unit 13 to be turned off either simultaneously or earlier than the point in time word line 21 is turned off. In this case, even if transistors 25 and 26, which are deployed on the near-end side of sense amplifier 35, are in an ON state, since the digit lines have a large capacitance, a read-out voltage difference can occur on the digit lines near memory cell 22 as long as far-end side pre-charge (equalize) unit 13 is in an OFF state.

Accordingly, it is possible to access memory cell 22 at a high speed (i.e., it is possible for sense amplifier 35 to have an earlier latch timing). More specifically, it is important to provide a structure that allows a word line on the far-end side of sense amplifier 35 to be selected as quickly as possible and also the pre-charge (equalize) operation to be halted as quickly as possible independent from the operation on the near-end side. The semiconductor memory device, according to the present invention, has a layout structure to provide high speed operation as described above.

It is noted here that if the timing for halting the pre-charge operation is earlier than the timing for a word line to be in an ON state, the read-out operation is performed in an unstable voltage state of the digit lines, possibly causing a fault to happen.

Accordingly, it is possible to apply controls to prevent such a fault from occurring using an alternative control circuit obtained by modifying the timing for pre-charge control circuit 40. It is noted here that such a control circuit is required only in the cases where the timing gap between the above-mentioned pre-charge and word line related operation is greater than approximately 5 ns; however, the control circuit is not necessary in the other cases.

Figure 5:
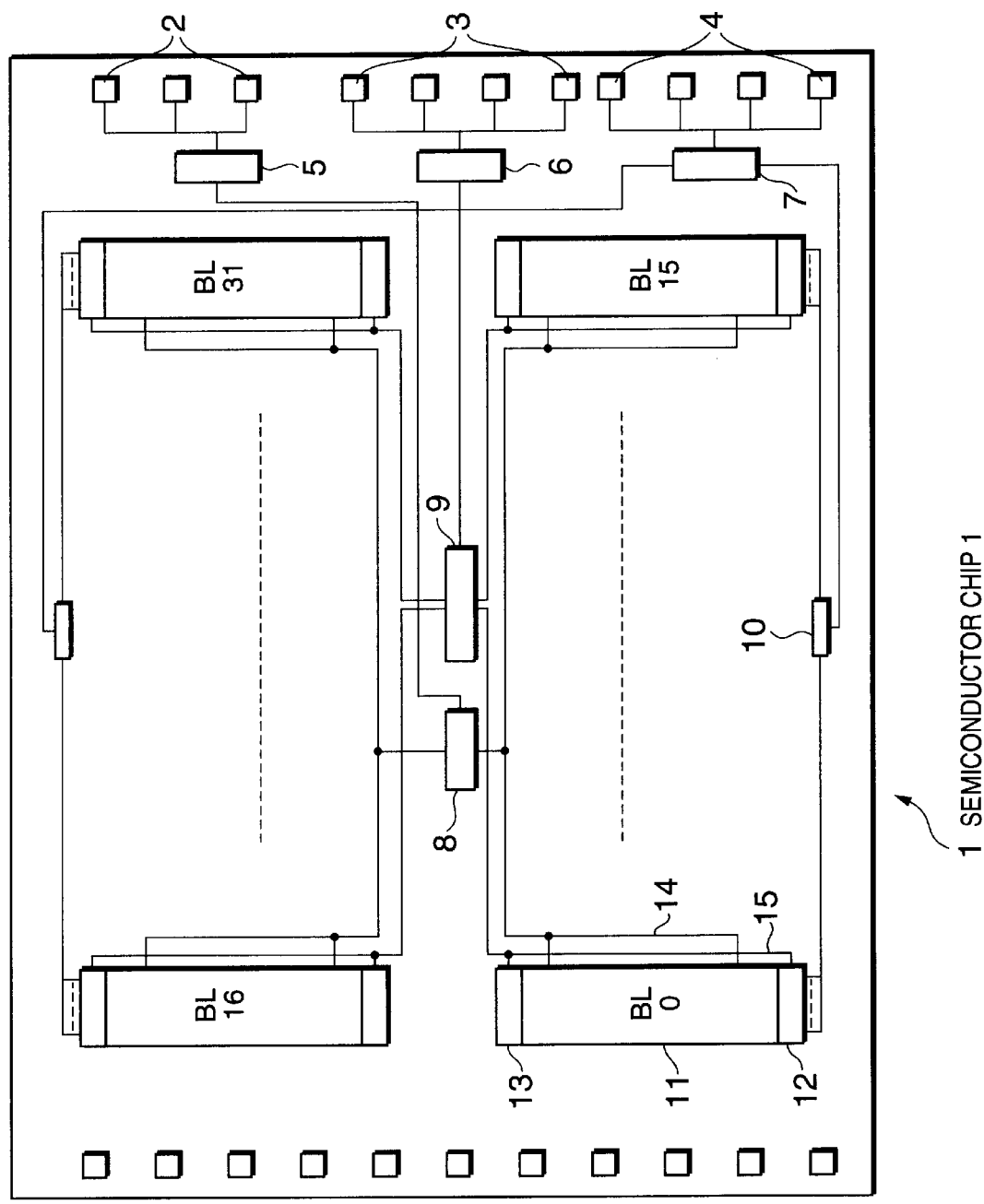
FIG. 5 is a diagram showing a layout of the second embodiment, according to the present invention.

FIG. 5 is a diagram showing the second embodiment of the present invention. It is noted here that the same parts in FIG. 5 as those in FIG. 2 are labeled with the same respective reference numerals and repetitive descriptions are omitted. What is different from the first embodiment shown in FIG. 2 is that the second embodiment does not use a NAND gate. In the second embodiment, the pre-charge circuits deployed at either end of the digit lines are controlled in conformity with only a signal transmitted from block selection signal line 15 independent from the column selection signal.

With this configuration, as is apparent from FIG. 5, block signal driver 9 is deployed in the center of the chip; the output signal of block signal driver 9 is input to far-end side pre-charge unit 13 via block selection signal line 15, and then input to near-end side pre-charge unit 12. Accordingly, like the first embodiment, the second embodiment is configured in such a manner that the pre-charge operation on the far-end side of the sense amplifier can halt earlier during the read-out operation. Besides this, the control of word lines is performed in the same manner as that in the first embodiment.

Figure 6:
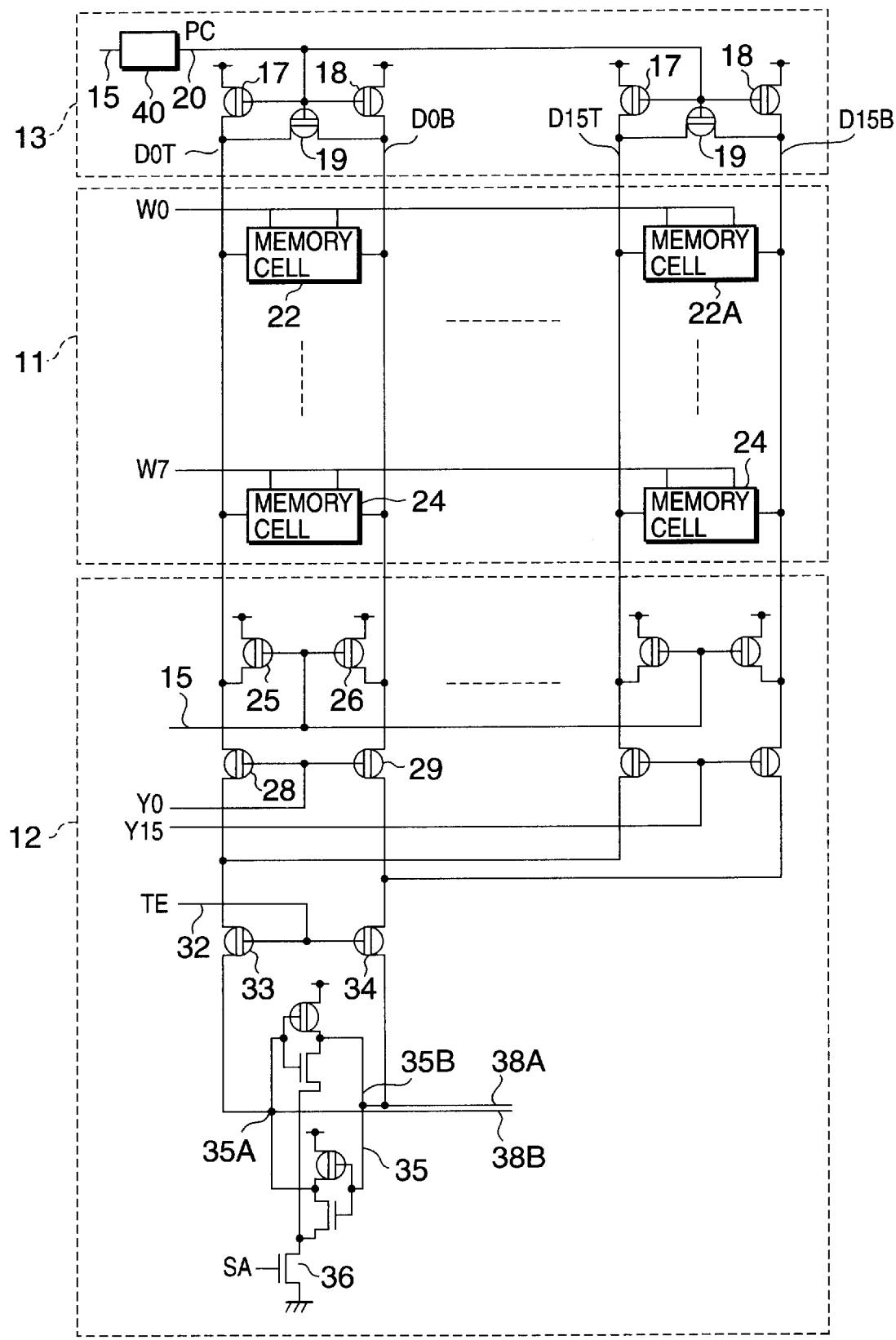
FIG. 6 is a circuit diagram of a memory block of the second embodiment, according to the present invention.

FIG. 6 is a circuit diagram of a memory block of the second embodiment. It is noted here that the same parts in FIG. 6 as those in FIG. 3 are labeled with the same respective reference numerals and repetitive descriptions are omitted. What is different from the first embodiment is that in the second embodiment the gates of transistors 25 and 26 are commonly connected to block selection signal line 15, which transmits the output signal of block signal driver 9, without inverter 27.

In the third embodiment, the pre-charge control circuit 40 with the timing for halting the pre-charge operation is modified into an alternative control circuit with the timing that allows the pre-charge operation to halt after a ward signal is sensed. This aims to prevent an occurrence of a fault, which emanates from the fact that the pre-charge operation is halted too early. More specifically, this can be configured with a NAND gate, which logically NANDs the signals of word signal line 14 and block selection signal line 15.

Thus far, the preferred embodiments have been explained; however, the present invention is not limited to these embodiments; and they may be suitably modified within the scope that does not depart from the points of the present invention. For example, four or more memory block arrays, each having memory blocks (BL0 to BL15, etc.) arranged in a horizontal direction, may be stacked in a vertical direction; or four or more memory block arrays may be arranged in a matrix shape. Furthermore, a sub-word signal driver and/or a sub-word signal decoder may be deployed between word signal driver 8 and a word line. Furthermore, one or more additional pre-charge units may be deployed in the center of each pair of digit lines.

[Results of the Present Invention]

As described above, in the semiconductor memory devices, according to the present invention, by turning off the pre-charge (equalize) unit deployed on the far-end side of the sense amplifier earlier, but turning on a word line on the far-end side earlier, the voltage on the digit lines deployed on the far-end side, which adversely influence the access time, is increased in a short time, allowing for a high speed read-out operation.

Furthermore, by combining the circuits for word selection and pre-charge timing control, an occurrence of a fault due to the fact that the pre-charge operation halts too early can be prevented.

What is claimed is:

1. A semiconductor memory device, comprising:

a plurality of memory cells;

a digit line connected to each memory cell and having first and second ends;

a plurality of word lines each crossing said digit line and each coupled to an associated one of said memory cells;

a word driver for activating one of said word lines that corresponds to a content of a word selection signal;

an input buffer coupled to receive said word selection signal;

a first pre-charge circuit arranged on a side of said first end of said digit line; and a second pre-charge circuit arranged on a side of said second end of said digit line;

a sense amplifier arranged near to said first pre-charge circuit;

said word lines including a first word line near to said first pre-charge circuit and a second word line near to said second pre-charge circuit;

wherein a period of time from said input buffer receiving a first word selection signal to activation of said second word line is shorter than a period of time from said input buffer receiving a second word selection signal to activation of said first word line.

2. The device mentioned in claim 1, wherein the completion of the pre-charge operation of the second pre-charge circuit during a read-out operation is simultaneous to or earlier than that of the first pre-charge circuit.

3. The device as claimed in claim 1, wherein said word driver is arranged near to said second pre-charge circuit and far from said first pre-charge circuit.

4. The device as claimed in claim 3, further comprising:

a first driver for driving said first and second pre-charge circuits, said first driver connected to said first pre-charge circuit by a first wiring having a first length, and said first driver connected to said second pre-charge circuit by a second wiring having a second length shorter than said first length.

5. The device as claimed in claim 4, further comprising a second driver for selecting said digit line, wherein said first driver is arranged near to said second pre-charge circuit and far from said first pre-charge circuit and said second driver is arranged near to said first pre-charge circuit and far from said second pre-charge circuit.

6. The device as claimed in claim 5, wherein during one read-out operation, the completion of a pre-charge operation of said second pre-charge circuit is earlier than that of said first pre-charge circuit.

\* \* \* \* \*